(12) United States Patent
Knoblauch

(10) Patent No.: US 6,170,562 B1
(45) Date of Patent: Jan. 9, 2001

(54) DEVICE FOR THE EXCHANGE OF THERMAL ENERGY BETWEEN THE INTERIOR OF A HOUSING AND AN ENVIRONMENT

(75) Inventor: Harald Knoblauch, Hamburg (DE)

(73) Assignee: Otto Pfannenberg Elektro-Spezial-Geratebau GmbH, Hamburg (DE)

(*) Notice: Under 35 U.S.C. 154(b), the term of this patent shall be extended for 0 days.

(21) Appl. No.: 09/141,310

(22) Filed: Aug. 27, 1998

(30) Foreign Application Priority Data

Sep. 17, 1997 (DE) .......................... 297 16 682 U

(51) Int. Cl.⁷ .................................................. F28D 15/00
(52) U.S. Cl. ............... 165/104.33; 165/122; 165/104.34; 361/384
(58) Field of Search ............................ 165/80.3, 104.14, 165/104.33, 104.34, 122; 361/384

(56) References Cited

U.S. PATENT DOCUMENTS

| 3,559,728 | * | 2/1971 | Lyman ........................... 165/104.34 |
| 4,386,651 | * | 6/1983 | Reinhard ........................ 165/104.33 |
| 4,449,579 | * | 5/1984 | Miyazaki et al. ................ 165/104.33 |
| 4,911,231 | * | 3/1990 | Horne et al. .................... 165/104.33 |
| 4,949,218 | * | 8/1990 | Blanchard et al. ............. 165/104.33 |
| 5,035,281 | * | 7/1991 | Neuenfeldt et al. ............ 165/104.34 |
| 5,054,545 | * | 10/1991 | Ghaemian ...................... 165/104.33 |
| 5,203,178 | * | 4/1993 | Shyu .................................. 62/180 |
| 5,287,244 | * | 2/1994 | Hileman et al. ..................... 361/687 |
| 5,333,676 | * | 8/1994 | Mizuno .......................... 165/104.33 |

* cited by examiner

Primary Examiner—Ira S. Lazarus
Assistant Examiner—Terrell McKinnon
(74) Attorney, Agent, or Firm—Friedrich Kueffner

(57) ABSTRACT

A device (200) for the exchange of thermal energy between an interior of a housing, more particularly for a telecommunication apparatus and an environment, in order to convey heat from the housing interior to the outside and, in this case, in order to maintain the internal temperature for the components involved within tolerated limits one heat exchanger block (11) possesses two fluid duct systems (12,16) which are separated from each other and that are in thermal energy-transmitting contact with each other, while a first fluid duct system (12) communicates with the housing interior and a second fluid duct system (16) communicates with the surroundings and each fluid duct system (12,16) has allocated to it one fluid pump (22,24) each for conveying a first working fluid (18) in the first fluid duct system (12) and a second working fluid (20) in the second fluid duct system (16).

13 Claims, 4 Drawing Sheets

DEVICE FOR THE EXCHANGE OF THERMAL ENERGY BETWEEN THE INTERIOR OF A HOUSING AND AN ENVIRONMENT The invention relates to a device for the exchange of thermal energy between the interior of a housing, more particularly for a telecommunication apparatus and an environment according to the preamble of the claim 1.

BACKGROUND OF THE INVENTION

The housing of an electrical apparatus, by way of example a transmission cabinet with radio equipment contained therein for a mobile telephone system, does in particular comprise electric components which generate waste heat. In order to avoid an overheating of the electric equipment, this waste heat has to be eliminated.

Since such housings normally are air-tight or hermetically sealed containers, the employment of a simple waste heat extractor fan is not possible.

That is why it is the technical problem of the present invention to provide a device of the type stated above, which conveys heat from a housing interior to the outside and maintains the internal temperature for the components involved within tolerated limits.

This technical problem is resolved by a device of the above-mentioned type possessing the features characterized in claim 1.

SUMMARY OF THE INVENTION

For this purpose, in the air—air heat exchanger according to the invention, a heat exchanger block is provided with at least two fluid duct systems that are separated from each other and which are in thermal energy-transmitting contact with each other, in which case a first fluid duct system communicates with the interior of the housing and a second fluid duct system communicates with the environment and wherein, to each fluid duct system, at least one fluid pump each is allocated for the conveyance of a first working fluid in the first fluid duct system and of a second working fluid in the second fluid duct system.

This has the advantage that the heat is eliminated in an indirect manner, thus without the removal of fluid from the housing interior and without an intermingling of fluid in the housing interior, i.e. the first working fluid and the second working fluid, taking place. That is why the device according to the invention can be employed especially with insulated, airtight or hermetically sealed housings.

Further developments of the device are preferably described in the subclaims.

A particularly simple, effective and maintenance-friendly arrangement is achieved in that the heat exchanger block is mounted externally on the housing and in that pertinant apertures for the inflow of fluid and the outflow of fluid are provided between the housing interior and the first fluid duct system.

Expediently, the first and/or the second working fluid is air and, by preference, the fluid pumps are fans, in particular radial fans, axial fans or tangential fans.

In a specially preferred embodiment, which permits a particularly good heat exchange to be effected between the interior of the housing, the heat exchanger block comprises a cross reverse flow plate exchanger or counter-current plate exchanger.

In order to reduce weight and so as to enhance the corrosion resistance, the heat exchanger is preferably manufactured from aluminum and/or plastic, more particularly polypropylene (PP).

In order to ensure a predetermined temperature in the in-interior of the housing or in the first fluid duct, a controller is provided in the interior of the housing, which controls the speed of at least one fan. This controller possesses, in a specially preferred manner, a malfunction reporting output.

Expediently, the housing is airtight, more especially, hermetically sealed in relation to the environment.

In order to avoid the falling below a dew point of at least one working fluid, in a specially preferred embodiment, provision is made for a heating means, particularly a resistance heating element.

BRIEF DESCRIPTION OF THE DRAWINGS

In the following, the invention is described in greater detail with the aid of the attached drawings. Thus

DETAILED DESCRIPTION OF THE PREFERRED EMBODIMENT

Figure 1:
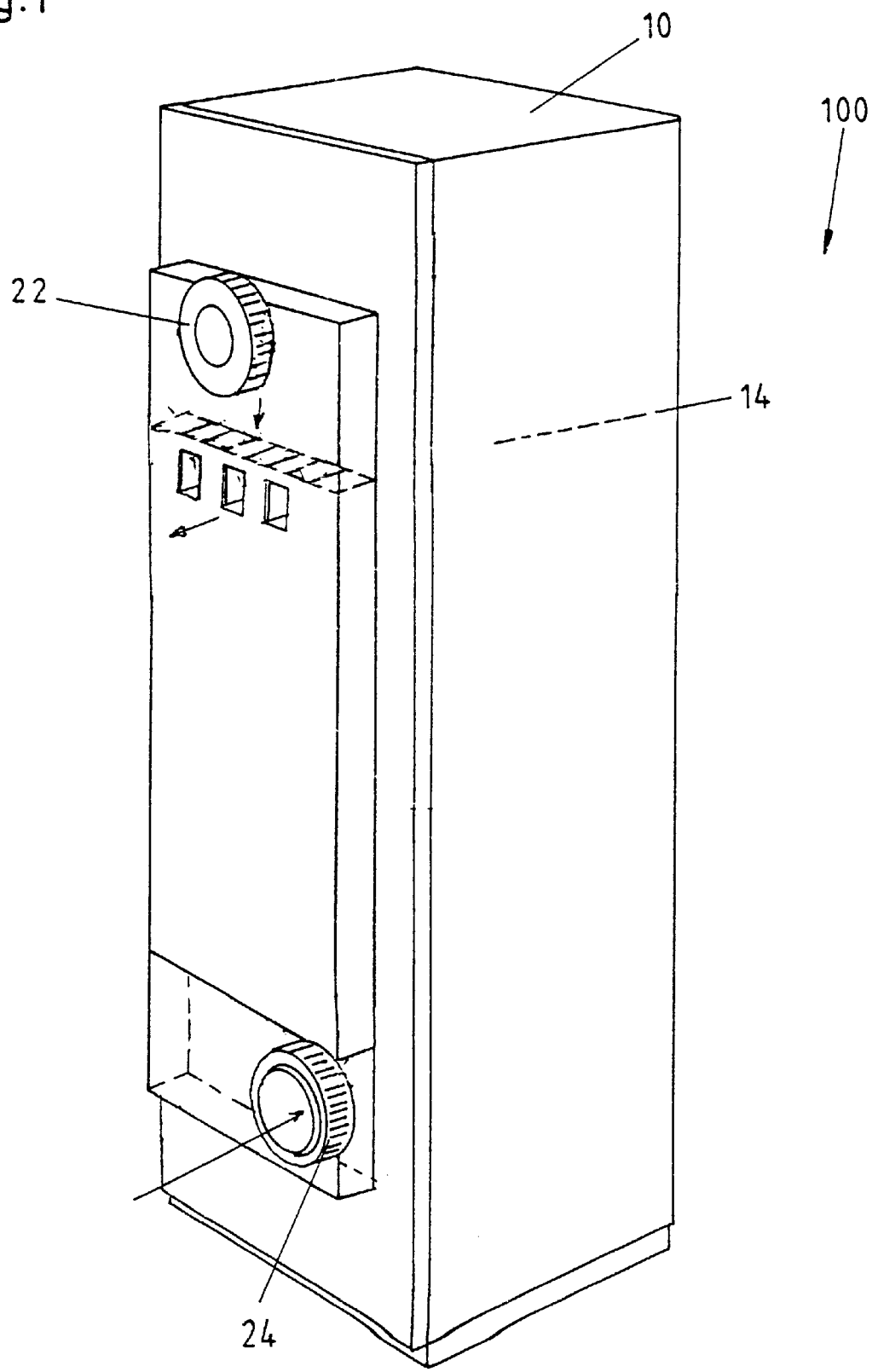
FIG. 1 shows an embodiment of a device for the exchange of thermal energy in a diagrammatical representation.
Figure 3:
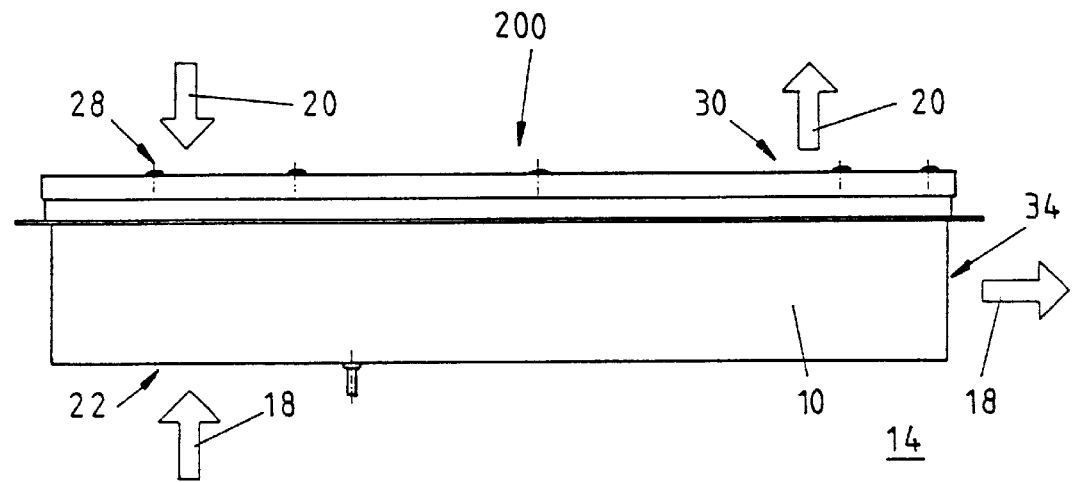
FIG. 3 shows the device in a side view in the direction of the arrow B in FIG. 2.

The embodiment of a device 100 depicted in FIG. 1 comprises a housing 10 and a heat exchanger block 11 with a first fluid duct system 12 (FIG. 2), which communicates with an interior 14 of the housing 10, and a second fluid duct system 16, which communicates with an environment. In the fluid duct system 12,16, referred to hereinafter also as internal circuit 12 and external circuit 16, in each case, air is circulated as working fluid 18,20 ny means of fluid pumps in the form of radial fans 22 and 24 (FIG. 3). In this case, the radial fan 22 conveys the air 18 in the interior 14 of the housing 10 through the first fluid duct system 12 and the radial fan 24 conveys the surrounding air through the second fluid duct system 16.

The heat exchanger block 11 is constructed in the form of an inverse flow plate exchanger and effects a heat exchange between the air 18 in the interior 14 of the housing 10 and the air 20 of the environment so that thermal energy from the interior 14 is evacuated to the outside.

The FIGS. 2 through 6 depict a further embodiment of the device 200. In this case, as is discernible from FIG. 2, the heat exchanger block 11 is constructed in the form of a cross counterflow plate heat exchanger. Cold ambient air 20 penetrates into the second fluid system 16 and issues again slightly heated via an aperture 30, whereas warm interior air 18 of the housing enters via an aperture 32 into the first fluid system 12 of the heat exchanger block 11 and issues again cooled via an aperture 34.

Figure 4:
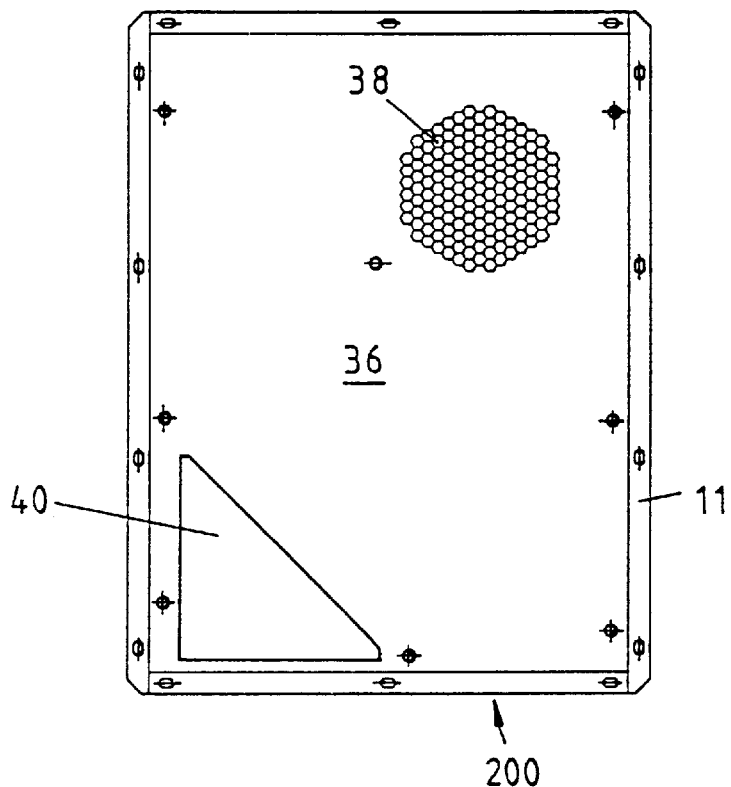
FIG. 4 shows the device in a view from the top.
Figure 5:
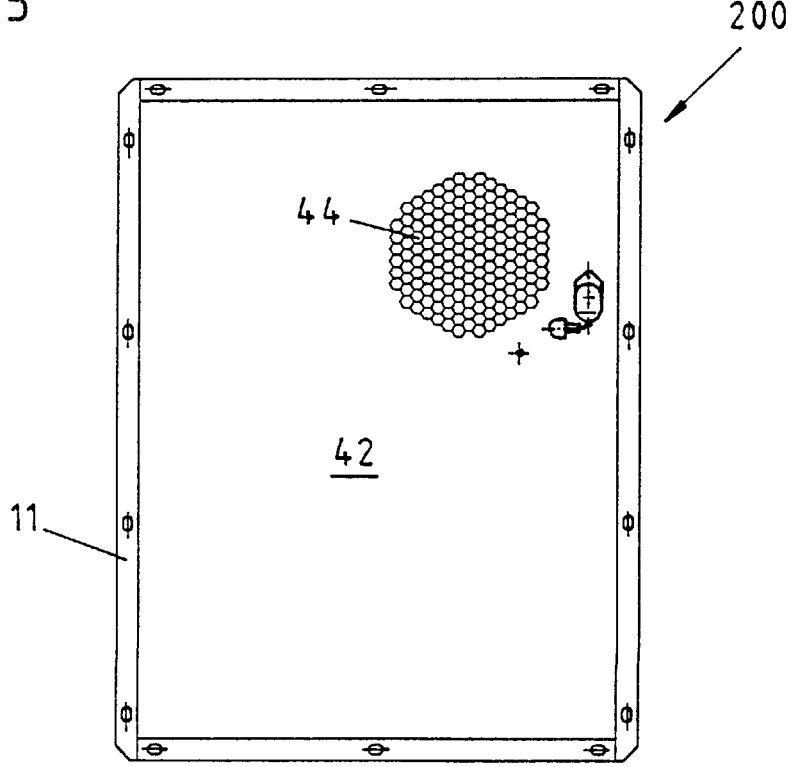
FIG. 5 shows the device in a rear view.

A bottom part 36 with pertinent apertures 38 and 40 for the air inlet 28 and the air outlet 30 of the ambient air 20 is depicted in FIG. 4. A cover part 42 with a pertinent aperture 44 for the air inlet 32 of the ambient air 18 becomes apparent from FIG. 5.

Figure 6:
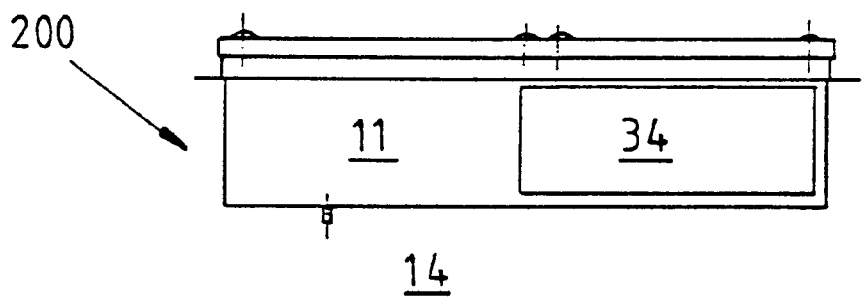
FIG. 6 shows the device in a further side view in the direction of the arrow A in FIG. 2.

The FIGS. 3 and 6 illustrate the inflow and the outflow of the ambient air 20 and interior air 18 into and out of the heat exchanger block 11 via apertures 28,30,32 and 34.

Figure 2:
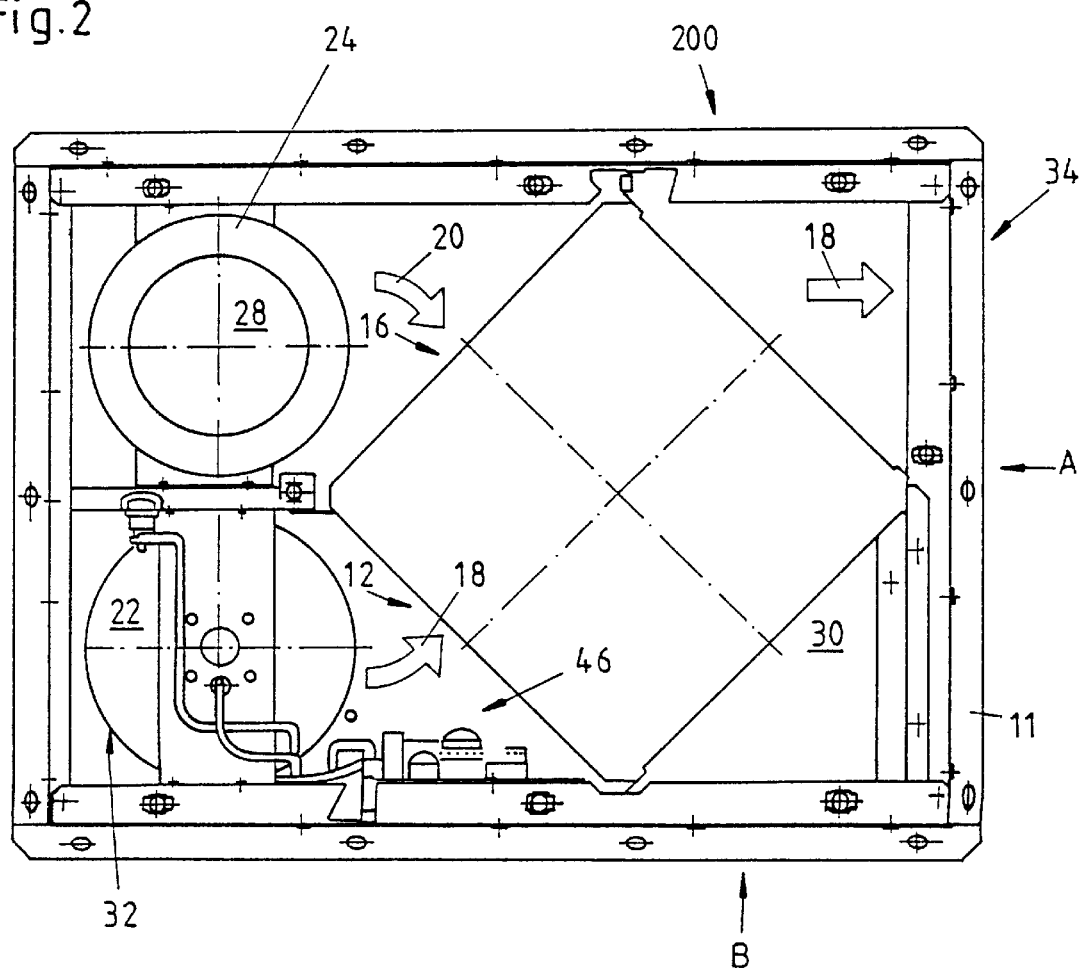
FIG. 2 shows an embodiment of the device in a sectioned view.

As results from FIG. 2, a controller 46 is provided in the first fluid duct 12. This records the temperature of the interior air 18 and, depending on this value, determines a speed for the fan 22 in such a fashion that a maximal interior temperature in the housing is not exceeded.

The cross counterflow heat exchanger according to FIG. 2 is preferably comprised of polypropylene and possesses the following advantages:

An easy cleaning of the external air path 16 since the plates are deformed simply and can be washed down with a high-pressure steam jet. Since the surface is a smooth closed-pore one, particles of dirt hardly adhere to the surface areas.

The weight saving is 15% with the same performance in comparison with aluminum. By means of the constructional principle according to the invention, a simple assembly and disassembly of all components (especially exchanger block 11 and fans 22,24) is possible, this is especially servicing-compatible. In polypropylene heat exchangers, the plates are preferably bonded, which makes an absolute separation of internal and external circuit 12,16 possible (no leakage rate or intermingling). The specification according to IP 54 is surpassed. The selection of the materials (aluminum housing plus polypropylene heat exchanger) results in an extremely corrosion-resistant end apparatus.

In this case, the use of aluminum has the following advantages:

On account of the constructional principle of the device, a simple assembly and disassembly of all components (especially heat exchanger block 11 and fans 22,24) is possible; this is particularly servicing-compatible.

The design of the housing and of the heat exchanger in aluminum throughout leads to a corrosion-resistant end apparatus.

The counterflow plate heat exchanger according to FIG. 11 is comprised preferably of polypropylene and has the additional advantage of a cross counterflow heat exchanger.

Due to the exchanger principle, extremely flat structural configurations can be realized.

The heat exchanger block 11 is preferably fabricated from a series of aluminum sheets; the corners are alternatingly compressed so as to form 2 sets of narrow air passages 12, 16, one for the surrounding air 20 and one for the circulating air 18. The warm air stream 18 gives off heat to the cold air stream 20, however, without any intermingling of the air streams taking place.

The mechanical data of the heat exchanger block in an exemplary embodiment are as follows:

| Dimensions | 300 × 300 × 120 mm |
|---|---|
| Weight | 50 kg |
| Plate spacing | 3 mm |
| Plate thickness | 0.4 mm |
| Number of ducts | 19. |

The fans 22,24 are located at the top on the right and on the left on the heat exchanger block 11 as per FIG. 2. They are radial fans 22m24 which, by way of example, are driven by collector-less 48V DC motors. The motors are speed-controlled by means of pulse-width modulation and are speed-monitored (Hall generator). The internal fan 22 runs permanently at 50% minimum and 100% at maximal internal temperature. The external fan 24 runs from 35° C. internal temperature at 50% speed and goes up to 100% at maximal internal temperature. The motors are speed-regulated by means of pulse width modulation at 48V DC and phase sector control at 230V AC.

For the dimensioning the following example results:

| Fan wheel | 190 mm diameter |
|---|---|
| Air delivery volume | 300 m³/h |
| External static pressure | 100 Pa |
| Voltage | 48 V DC |
| Power consumption | 62 Watt |
| Full load current | 1.3 Amp |
| Starting current consumption | 4 Amp. |

The above-stated specifications apply exemplarily to external and internal fans.

Optimally, an external heating means is provided, which, at 7° C., is activated from a controller.

A control system used comprises a circuit board with the following connections:

Speed control for the fans 22,24 by means of a temperature sensor on the circuit board for 2 fans and a 48V output for an external heating relay for an alarm signal (malfunction fan) and excess temperature; potential-free contacts.

The temperature sensor measures the temperature of the reconveyed air 18 and adapts the speed of the external and the internal fans 22,24 accordingly. The target value is e.g. 45° C.

The external fan starts at approximately 35° C. and reaches the highest speed at the target value.

The alarm temperature is e.g. 48° C. In the event of a fan failure or a temperature alarm, a potential-free contact is actuated, which can be processed further externally.

The following control table results:

| Temp. °C. | <0°–5° | 5°–7° | 7°–25° | 25°–30° | 30°–35° | 35°–40° | 40°–43° | 43°–48° | >60° |
|---|---|---|---|---|---|---|---|---|---|
| Fan 50% | 60% | 60% | 60% | 70% | 80% | 80% | 100% | 100% | 100% |
| Fan | off | off | off | off | off | 50% | 70% | 100% | 100% |
| Alarm | off | off | off | off | off | off | off | off | on |
| Temp. Heater | on | on | off | off | off | off | off | off | off |

By way of example, the main date of the device are as follows:

| Dimensions | 460 × 640 × 130 mm |
|---|---|
| Weight | 14 kg |
| Operating temperature | −35° C. to +60° C. |
| Maximal internal temperature | 55° C. |
| Maximal external temperature | 40° C. |
| Maximum rate of heat extraction | 64 W/K |
| Voltage | 48 V DC |
| Power consumption | 124 Watt |
| Full load current | 2.6 Amp |
| Starting current consumption | 6 Amp. |

A servicing of the device is effected as described below:
1. Cleaning the fans:

Dust, which settles on the fans (particularly in the external fan 24) has, for example, to be removed every 6 months in order to ensure a perfect operation as well as to avoid vibration, which leads to bearing damage and reduces the useful service life of the fans. Clean the fan with compresssed air or, in special cases, with a brush and a pH-neutral soap solution (only the external fan). Deposits on the internal fan mean that the switch cabinet or the housing 10 is not airtight or properly sealed. For this, special measures have to be taken.

2. Cleaning the heat exchanger block 11:

Dust, which settles on the heat exchanger block 11 (particularly in the external fan circuit 16) has, for example, to be removed every 6 months in order to ensure a perfect operation. The heat exchanger block 11 has to be cleaned with compressed air or, in special cases, with a pH-neutral soap solution, which is sprayed on with compressed air (only in the external air circuit 16). The fan must not be sprayed with water and solely the external air circuit of the heat exchanger block is to be cleaned. When using compressed air or water spray, care has to be taken that the seals are not damaged.

With certain components it can happen that they will have to be replaced in the course of the service life of the device. The following procedures have to be had regard to when replacing spare component parts.

Prior to any maintenance operations, the PLL circuit has to be rendered currentness.

1. General

The fans, the circuit board and the heat exchanger block can be readily reached after the hood is removed.

2. Control unit (circuit board)

Clamp off all cables. Remove the 4 screws retaining the circuit board. Remove the circuit board. Then clamp on all the cables once more and insert the new circuit board. Check that all the connections have been effected correctly (see connection diagram). Make certain that no cables rest against the fans.

3. Internal fan (DC fan)

Clamp off the circuit board cables. Remove the four screws retaining the fan supports, remove the four screws on the rear of the fan support, remove the fan. Insert the new fan, fit the screws in reversed sequence as aforetstated, connect cables. Check that all connections have been carried out correctly (see connection diagram) and that no cables are resting against the fan.

4. External fan (DC fan)

As above—Internal fan)

5. Heat exchanger block

Detach the clamping fixture located on the separating plate between the two fans and remove the exchanger block 11. Check the seals! Then insert the new exchanger block and clamp fast the same.

| List of Reference Numbers | |
| --- | --- |
| Device | 100,200 |
| housing | 10 |
| heat exchanger block | 11 |
| first fluid duct system | 12 |
| interior | 14 |
| second fluid duct system | 16 |
| working fluid, internal | 18 |
| working fluid, external | 20 |
| radial fans, internal | 22 |
| radial fans, external | 24 |
| aperture | 28 |
| aperture | 30 |
| aperture | 32 |
| aperture | 34 |
| bottom part | 36 |

| -continued | |
| --- | --- |
| List of Reference Numbers | |
| aperture | 38 |
| aperture | 40 |
| cover part | 42 |
| aperture | 44 |
| controller | 46. |

What is claimed is:

1. A device for the exchange of thermal energy between the interior of a housing, more particularly a housing for a telecommunication apparatus, and the environment of said housing, said device comprising:

a heat exchanger block with at least two fluid duct systems that are separated from each other;

a first one of said at least two fluid duct systems communicating with said interior of said housing;

a second one of said at least two fluids duct systems communicating with said environment of said housing;

said first fluid duct system having at least one fluid pump configured to convey a first working fluid in said first fluid duct system;

said second fluid duct system having at least one fluid pump configured to convey a second working fluid in said second fluid duct system; and a controller mounted in said interior of said housing or in said first fluid duct and configured to control a speed of said fluid pumps of said first and second fluid duct systems based on an internal temperature in said interior of said housing such that said fluid pump of said first fluid duct system runs permanently with a speed variable between a minimum speed and a maximum speed while said fluid pump of said second fluid duct system is switched on at a predetermined minimum value of said internal temperature and reaches a highest speed at a predetermined maximum value of said internal temperature.

2. The device according to claim 1, wherein said minimum speed of said fluid pump of said first fluid duct system is 50% of said maximum speed of said fluid pump of said first fluid duct system, said predetermined minimum value of said internal temperature is 35° C., and said predetermined maximum value of said internal temperature is 55° C.

3. The device according to claim 1, wherein said heat exchanger block is mounted externally on said housing and wherein said housing has apertures allowing flow of said first working fluid between said interior of said housing and said first fluid duct system.

4. The device according to claim 1, wherein at least one of said first and second working fluid is air.

5. The device according to claim 1, wherein said fluid pumps of said first and second fluid duct systems are fans selected from the group consisting of radial fans, axial fans, and tangential fans.

6. The device according to claim 1, wherein said heat exchanger block comprises a cross-counterflow or counterflow plate exchanger.

7. The device according to claim 1, wherein said heat exchanger is made of aluminum, plastic, or a combination of aluminum and plastic.

8. The device according to claim 7, wherein said plastic is polypropylene.

9. The device according to claim 1, wherein said controller has a malfunction reporting output.

10. The device according to claim 1, wherein said housing is airtight relative to the environment.

11. The device according to claim 10, wherein said housing is hermetically sealed relative to the environment.

12. The device according to claim 1, further comprising a heating means.

13. The device according to claim 12, wherein said heating means is a resistance heating element.

* * * * *